United States Patent
Zhou

(10) Patent No.: US 10,522,632 B2
(45) Date of Patent: Dec. 31, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/025,724

(22) Filed: Jul. 2, 2018

(65) Prior Publication Data

US 2019/0006478 A1 Jan. 3, 2019

(30) Foreign Application Priority Data

Jul. 3, 2017 (CN) .......................... 2017 1 0533393

(51) Int. Cl.
  *H01L 29/417* (2006.01)
  *H01L 29/08* (2006.01)
  (Continued)

(52) U.S. Cl.
  CPC .... *H01L 29/41775* (2013.01); *H01L 21/0217* (2013.01); *H01L 21/0228* (2013.01);
  (Continued)

(58) Field of Classification Search
  CPC ......... H01L 29/41775; H01L 21/76802; H01L 29/6656; H01L 21/76877; H01L 29/66795;
  (Continued)

(56) References Cited

U.S. PATENT DOCUMENTS 9,608,065 B1 * 3/2017 Bergendahl ......... H01L 27/0886
10,026,824 B1 * 7/2018 Chanemougame .......................... H01L 29/4991
(Continued)

OTHER PUBLICATIONS

Saraswat, Krishna; "Low-K dielectrics", Stanford class slides for EE331, https://web.stanford.edu/class/ee311/NOTES/Interconnect%20Lowk.pdf (Year: 2015).*
(Continued)

*Primary Examiner* — Karen Kusumakar
(74) *Attorney, Agent, or Firm* — Anova Law Group, PLLC

(57) ABSTRACT

A semiconductor structure and a method for fabricating the semiconductor structure are provided. The method includes forming a gate structure and a dielectric layer on a substrate; and forming a sidewall spacer on a sidewall surface of the gate structure. The method also includes forming a source and drain doped region in the substrate on both sides of the gate structure. The dielectric layer covers a surface of the sidewall spacer. In addition, the method includes forming a source-drain plug in the dielectric layer. The source-drain plug is connected to the source and drain doped region. Moreover, the method includes forming an isolation opening in the dielectric layer by at least partially removing the sidewall spacer. Further, the method includes forming an isolation structure in the isolation opening, wherein the isolation structure has a dielectric constant less than the sidewall spacer.

18 Claims, 5 Drawing Sheets

(51) Int. Cl.
- *H01L 21/768* (2006.01)
- *H01L 29/06* (2006.01)
- *H01L 21/02* (2006.01)
- *H01L 21/764* (2006.01)
- *H01L 29/66* (2006.01)
- *H01L 21/311* (2006.01)
- *H01L 29/78* (2006.01)
- *H01L 21/8234* (2006.01)
- *H01L 27/088* (2006.01)
- *H01L 21/285* (2006.01)
- *H01L 29/45* (2006.01)
- *H01L 21/84* (2006.01)
- *H01L 27/12* (2006.01)

(52) U.S. Cl.
CPC .. *H01L 21/02271* (2013.01); *H01L 21/31111* (2013.01); *H01L 21/764* (2013.01); *H01L 21/76802* (2013.01); *H01L 21/76877* (2013.01); *H01L 21/823431* (2013.01); *H01L 27/0886* (2013.01); *H01L 29/0649* (2013.01); *H01L 29/0847* (2013.01); *H01L 29/6653* (2013.01); *H01L 29/6656* (2013.01); *H01L 29/66545* (2013.01); *H01L 29/66795* (2013.01); *H01L 29/7851* (2013.01); *H01L 21/28568* (2013.01); *H01L 21/76897* (2013.01); *H01L 21/845* (2013.01); *H01L 27/1211* (2013.01); *H01L 29/45* (2013.01)

(58) Field of Classification Search
CPC ........... H01L 29/7851; H01L 21/31111; H01L 21/0228; H01L 21/02271; H01L 29/0847; H01L 21/0217; H01L 29/0649; H01L 29/66545; H01L 29/6653; H01L 21/764; H01L 21/28568; H01L 29/45
See application file for complete search history.

(56) References Cited

U.S. PATENT DOCUMENTS

2017/0141207 A1* 5/2017 Cheng ............... H01L 29/66742
2017/0141215 A1* 5/2017 Ching ............... H01L 29/66545

OTHER PUBLICATIONS

Robertson, J., "High dielectric constant oxides", 2004, Eur. Phys. J. Appl. Phys. 28, 265-291 (Year: 2004).*

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710533393.6, filed on Jul. 3, 2017, the entirety of which is incorporated herein by reference.

FIELD OF THE DISCLOSURE

The present disclosure generally relates to the field of semiconductor manufacturing technology and, more particularly, relates to a semiconductor structure and fabrication method thereof.

BACKGROUND

With the rapid development of semiconductor manufacturing technology, semiconductor devices have been developed toward with higher component density and higher integration degree. Transistors, as the most basic semiconductor devices, have been widely used. With the increasing of the component density and the integration degree of the semiconductor devices, dimensions of a transistor are scaled down.

The transistor includes: a substrate; a gate structure on the substrate; a sidewall spacer on a sidewall of the gate structure; a source and drain doped region in the substrate on both sides of the sidewall spacer; a dielectric layer on the gate structure and the source and drain doped region; and a source-drain plug in the dielectric layer. The source-drain plug is connected to the source and drain doped region. The source-drain plug, the gate structure and the sidewall spacer between the source-drain plug and the gate structure form a capacitor. If a capacitance value of the capacitor is large, a parasitic capacitance of the transistor is large, a RC (resistor-capacitor) delay effect of the transistor is likely to increase, and the performance of the semiconductor structure is degraded.

However, the parasitic capacitance of conventionally-formed semiconductor structures is large, and the performance of the semiconductor structure is poor and still needs to be improved. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes forming a gate structure and a dielectric layer on a substrate; and forming a sidewall spacer on a sidewall surface of the gate structure. The method also includes forming a source and drain doped region in the substrate on both sides of the gate structure. The dielectric layer covers a surface of the sidewall spacer. In addition, the method includes forming a source-drain plug in the dielectric layer. The source-drain plug is connected to the source and drain doped region. Moreover, the method includes forming an isolation opening in the dielectric layer by at least partially removing the sidewall spacer. Further, the method includes forming an isolation structure in the isolation opening, wherein the isolation structure has a dielectric constant less than the sidewall spacer.

Another aspect of the present disclosure includes a semiconductor structure. The semiconductor structure includes a gate structure on a substrate; and a source and drain doped region in the substrate on both sides of the gate structure. The semiconductor also includes a dielectric layer on the substrate. The dielectric layer covers a sidewall surface of the gate structure. In addition, the semiconductor structure includes a source-drain plug in the dielectric layer. The source-drain plug is connected to the source and drain doped region. Further, the semiconductor structure includes an isolation structure between the source-drain plug and the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
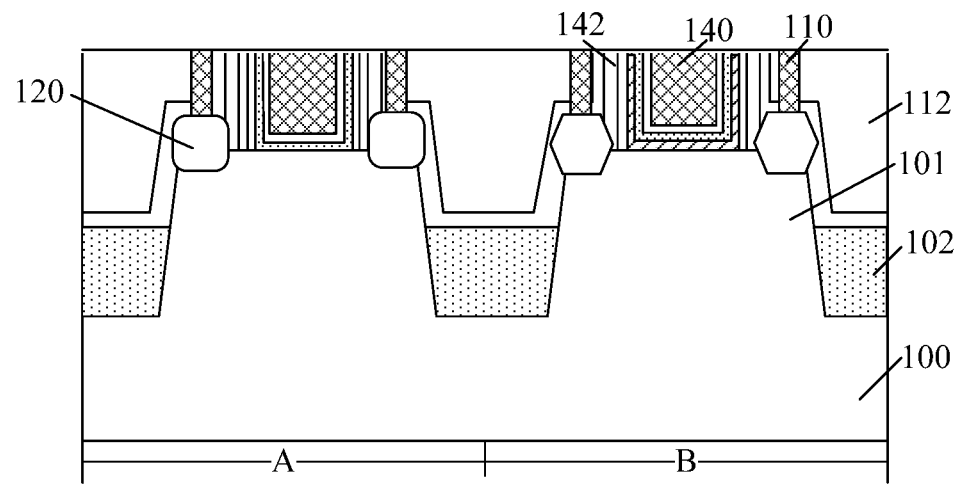
FIG. 1 illustrates a structural schematic of a semiconductor structure.

FIG. 1 illustrates a structural schematic of a semiconductor structure. Referring to FIG. 1, the semiconductor structure includes a plurality of discrete fins 101 on a substrate 100, and an isolation structure 102 on the substrate 100 between adjacent fins 101. The isolation structure 102 covers a portion of a sidewall of the fin 101. The semiconductor structure also includes a gate structure 140 across a length portion of the fin 101 and including a sidewall spacer 142 on a sidewall of the gate structure 140, and a source and drain doped layer 120 in the fin 101 on both sides of the sidewall spacer 142. Further, the semiconductor structure includes a dielectric layer 112 on the fin 101 and covering a sidewall of the sidewall spacer 142, and a plug 110 in the dielectric layer 112. The plug 110 is connected to the source and drain doped layer 120.

The dielectric layer 112 is made of silicon oxide. Silicon oxide has desired insulation performance and desired adhesion with the substrate 100. Forming the gate structure 140 and the dielectric layer 112 includes: forming a dummy gate structure across a length portion of the fin 101 and covering a portion of each of a sidewall and a top surface of the fin 101; forming the dielectric layer 112 on the substrate 100; form an opening in the dielectric layer 112 by removing the dummy gate structure; and forming the gate structure 140 in the opening. The dummy gate structure includes a gate oxide layer across the length portion of the fin 101, and a gate electrode on the gate oxide layer. During removing the dummy gate structure, to increase an etching selectivity ratio between the gate oxide layer and the sidewall spacer 142 and to reduce the loss of the sidewall spacer 142, the sidewall spacer 142 is made of silicon nitride. The plug 110, the gate structure 140, and the sidewall spacer 142, between the plug 110 and the gate structure 140, form a source-drain capacitor. Because a dielectric constant of silicon nitride is large, a capacitance value of the source-drain capacitor is large, and a parasitic capacitance of the semiconductor structure is large, resulting in a strong RC delay effect of the semiconductor structure.

The present disclosure provides a semiconductor structure and a fabrication method of the semiconductor structure. In the disclosed embodiments, an isolation opening may be formed in the dielectric layer by removing at least a portion of a sidewall spacer. An isolation structure may be formed in the isolation opening, where the isolation structure may have a smaller dielectric constant than the sidewall spacer. A gate structure, a source-drain plug, and the isolation structure, between the gate structure and the source-drain plug, may form a source-drain capacitor. The dielectric constant of the isolation structure may be substantially small, and, thus, a capacitance value of the source-drain capacitor may be substantially small, such that a parasitic capacitance of the formed semiconductor structure may be reduced, and the performance of the semiconductor structure may be improved.

Figure 11:
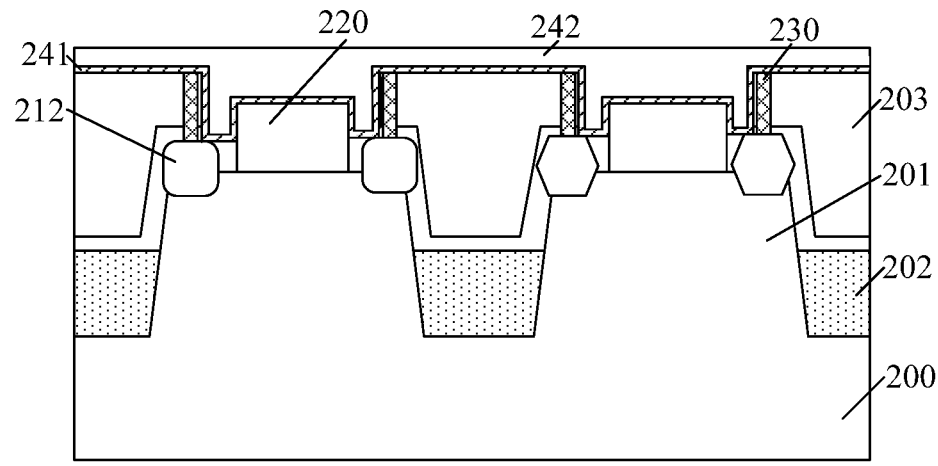
Figure 12:
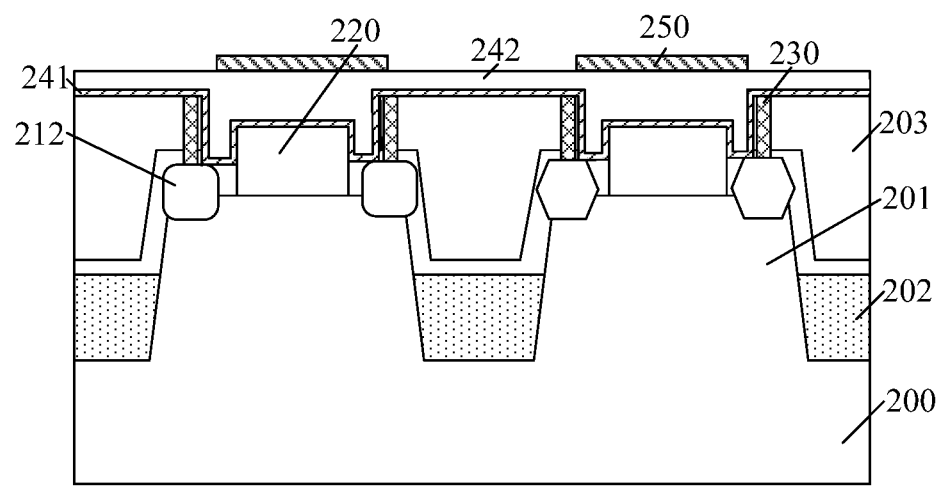
Figure 13:
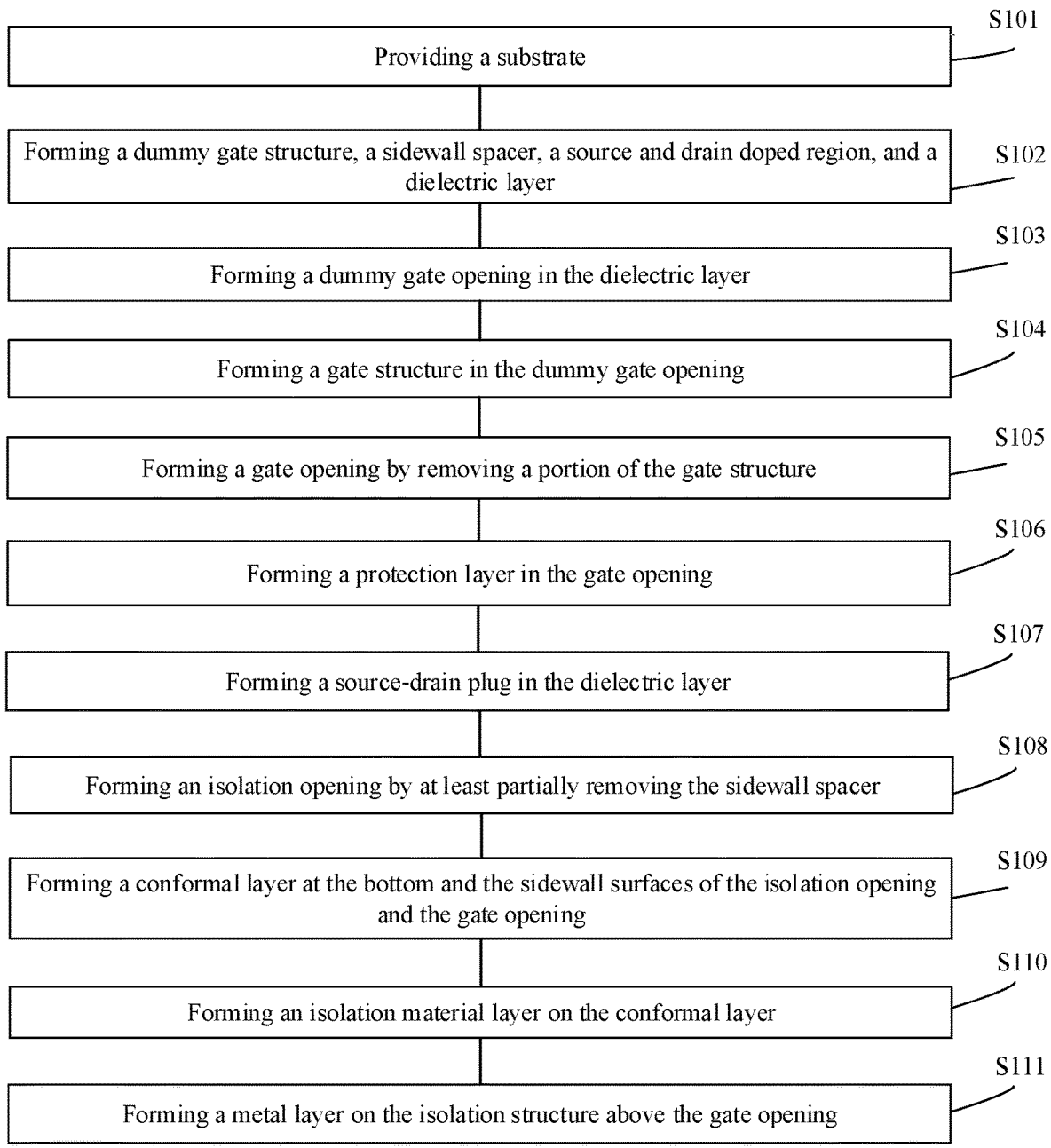
FIG. 13 illustrates an exemplary fabrication method for forming a semiconductor structure consistent with various disclosed embodiments of the present disclosure.

FIG. 13 illustrates an exemplary fabrication method for forming a semiconductor structure consistent with various disclosed embodiments of the present disclosure; and FIGS. 2-12 illustrate semiconductor structures corresponding to certain stages of the exemplary fabrication method.

Figure 2:
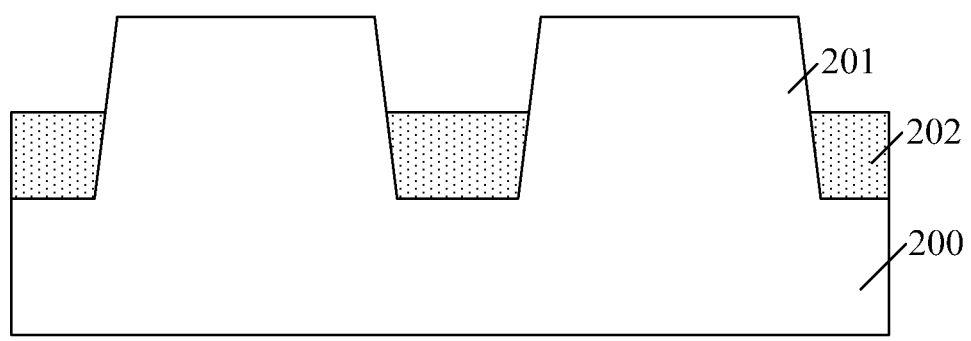
FIGS. 2-12 illustrate semiconductor structures corresponding to certain stages for forming an exemplary semiconductor structure consistent with various disclosed embodiments of the present disclosure.

As shown in FIG. 13, at the beginning of the fabrication method, a substrate with certain structures may be formed (S101). FIG. 2 illustrates a corresponding semiconductor structure.

Referring to FIG. 2, a substrate may be provided. The substrate may include a base substrate 200 and a plurality of discrete fins 201 on the base substrate 200. An isolation layer 202 may be formed on the base substrate 200. A top surface of the isolation layer 202 may be lower than a top surface of the fin 201, and the isolation layer 202 may cover a portion of a sidewall surface of the fin 201.

In one embodiment, the substrate may include the base substrate 200 and the plurality of discrete fins 201 on the base substrate 200. In another embodiment, the substrate may be a planar substrate. For example, the substrate may be a silicon substrate, a germanium substrate, a silicon germanium substrate, a silicon on insulator (SOI) substrate, a germanium on insulator (GOI) substrate, or any other suitable semiconductor substrate(s).

In one embodiment, the base substrate 200 and the fin 201 may be made of silicon. In another embodiment, the base substrate and the fin may be made of germanium, or silicon germanium, etc.

In one embodiment, the isolation layer 202 may be formed on the base substrate 200. The top surface of the isolation layer 202 may be lower than the top surface of the fin 201, and the isolation layer 202 may cover a portion of the sidewall surface of the fin 201. In another embodiment, the substrate may be a planar substrate. The substrate may include an isolation trench, and the isolation structure may be formed in the isolation trench. The isolation layer 202 may be made of silicon oxide, silicon nitride, or silicon oxynitride, etc. The isolation layer 202 may be formed by a fluid chemical vapor deposition process.

A gate structure and a dielectric layer may be subsequently formed on the substrate. A sidewall spacer may be formed on a sidewall surface of the gate structure. A source and drain doped region may be formed in the substrate on both sides of the gate structure. The dielectric layer may be formed on the substrate and cover a sidewall of the sidewall spacer.

Figure 3:
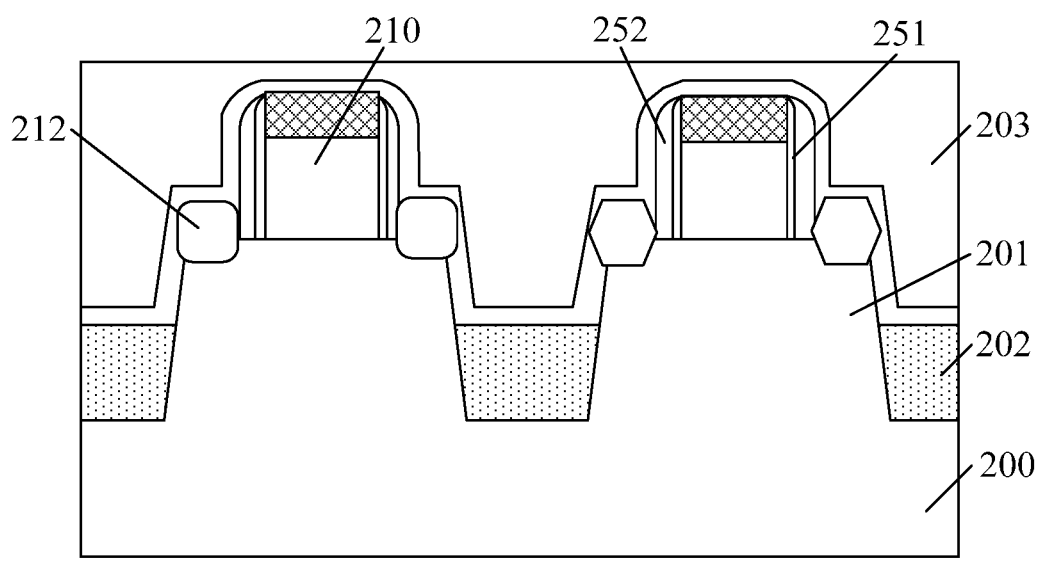

Returning to FIG. 13, after forming the substrate, a dummy gate structure, a sidewall spacer, a source and drain doped region, and a dielectric layer may be formed (S102). FIG. 3 illustrates a corresponding semiconductor structure.

Referring to FIG. 3, a dummy gate structure 210 may be formed on the substrate. A sidewall spacer including a first sidewall spacer 251 and a second sidewall spacer 252 may be formed on a sidewall surface of the dummy gate structure 210. A source and drain doped region 212 may be formed in the substrate on both sides of the sidewall spacer. A dielectric layer 203 may be formed on the source and drain doped region 212, and the dielectric layer 203 may cover a sidewall of the sidewall spacer.

In one embodiment, the semiconductor structure may be formed by a gate-last process. In another embodiment, the semiconductor structure may be formed by a gate-first process.

The dummy gate structure 210 may occupy a space for subsequently forming a gate structure. The sidewall spacer may define the position of the source and drain doped region 212 when forming the source and drain doped region 212. The dielectric layer 203 may electrically isolate subsequently formed gate structures and other structures.

The dummy gate structure 210 may include a gate oxide layer on the substrate, a dummy gate electrode on the gate oxide layer, and a mask layer on the dummy gate electrode. The gate oxide layer may be made of silicon oxide. The dummy gate electrode may be made of silicon, germanium, or silicon germanium, etc. The mask layer may be made of silicon nitride, or silicon oxynitride, etc.

In one embodiment, the sidewall spacer may include the first sidewall spacer 251 on the sidewall surface of the dummy gate structure 210, and the second sidewall spacer 252 on a surface of the first sidewall spacer 251. Both the first sidewall spacer 251 and the second sidewall spacer 252 may be made of silicon nitride.

Before forming the source and drain doped region 212, a lightly doped region may be formed in the substrate on both sides of the dummy gate structure 210. The first sidewall spacer 251 may define the position of the lightly doped region.

Forming the sidewall spacer and the lightly doped region may include: forming the first sidewall spacer 251 on the sidewall surface of the dummy gate structure 210, forming the lightly doped region in the substrate on both sides of the first sidewall spacer 251, and forming the second sidewall spacer 252 on the surface of the first sidewall spacer 251.

In one embodiment, the dielectric layer 203 may be made of silicon oxide. Silicon oxide has desired insulation performance and desired adhesion with the substrate. In another embodiment, the dielectric layer may be made of a low-K dielectric material, for example, carbon-doped silicon oxide, nitrogen-doped silicon carbide (BLOK) or fluorosilicone glass (FG), polyimide porous material, polyethylene porous material, fluoropolymer porous material, silsesquioxane based porous composite material, or zeolite polyimide composite porous material, etc. In one embodiment, the dielectric layer 203 may be formed by a chemical vapor deposition process, or a physical vapor deposition process, etc.

Figure 4:
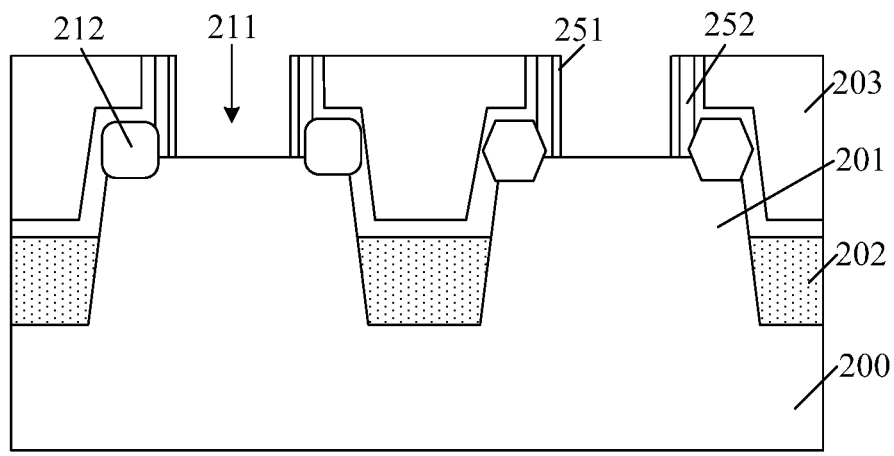

Returning to FIG. 13, after forming the dielectric layer, a dummy gate opening may be formed (S103). FIG. 4 illustrates a corresponding semiconductor structure.

Referring to FIG. 4, a dummy gate opening 211 may be formed in the dielectric layer 203 by removing the dummy gate structure 210 (illustrated in FIG. 3). The dummy gate opening 211 may be subsequently used to accommodate a gate structure.

Removing the dummy gate structure 210 may include: removing the mask layer, removing the dummy gate electrode after removing the mask layer, and removing the gate oxide layer after removing the dummy gate electrode. Removing the mask layer may include a chemical mechanical polishing process. Removing the dummy gate electrode and the gate oxide layer may include a dry etching process, or a wet etching process, etc.

The first sidewall spacer 251 and the second sidewall spacer 252 may be made of silicon nitride. The dummy gate electrode may be made of polysilicon. The gate oxide layer may be made of silicon oxide. When etching the dummy gate electrode, an etching selectivity ratio of the dummy gate electrode over the sidewall spacer may be substantially large. When etching the gate oxide layer, an etching selectivity ratio of the gate oxide layer over the sidewall spacer may be substantially large. Therefore, when removing the dummy gate structure, the loss of the sidewall spacer may be substantially small.

Figure 5:
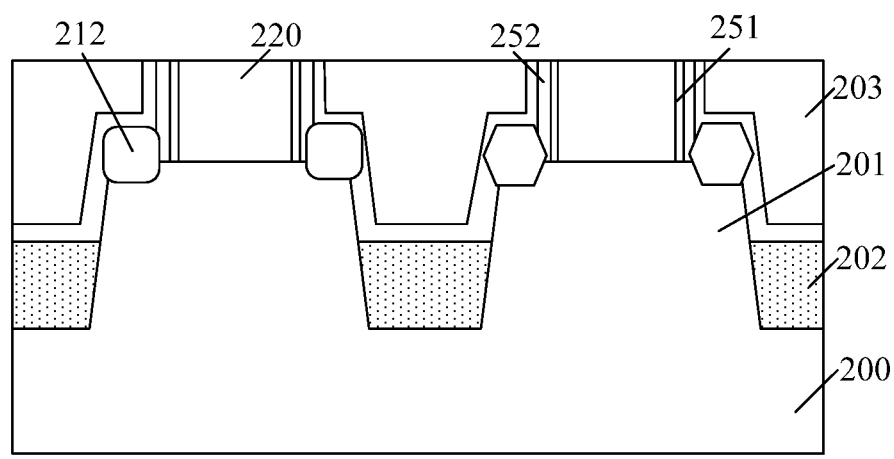

Returning to FIG. 13, after forming the dummy gate opening, a gate structure may be formed (S104). FIG. 5 illustrates a corresponding semiconductor structure.

Referring to FIG. 5, a gate structure 220 may be formed in the dummy gate opening 211 (illustrated in FIG. 4). The gate structure 220 may include a gate dielectric layer at a bottom and a sidewall surface of the dummy gate opening 211, a work function layer on the gate dielectric layer, and a gate electrode on the work function layer.

The gate dielectric layer may be made of a high-K dielectric material, such as $HfO_2$, $La_2O_3$, HfSiON, $HfAlO_2$, $ZrO_2$, $Al_2O_3$, or $HfSiO_4$, etc. The gate electrode may be made of a metal, such as Al, Cu, Ag, Au, Ni, Ti, W, WN, or WSi, etc.

In one embodiment, the gate dielectric layer may be formed by an organometallic chemical vapor deposition process. In another embodiment, the gate dielectric layer may be formed by a physical vapor deposition process, or an atomic layer deposition process, etc. In one embodiment, the gate electrode may be formed by an organometallic chemical vapor deposition process. In another embodiment, the gate electrode may be formed by a physical vapor deposition process, or an atomic layer deposition process, etc.

Figure 6:
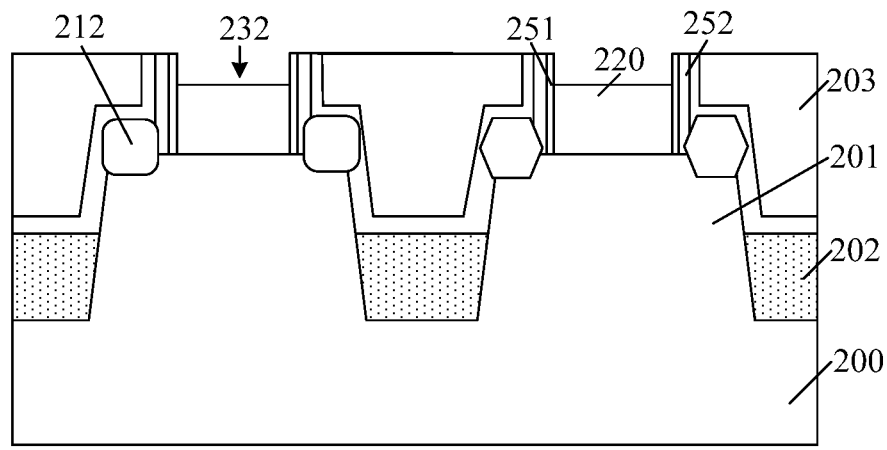

Returning to FIG. 13, after forming the gate structure, a gate opening may be formed (S105). FIG. 6 illustrates a corresponding semiconductor structure.

Referring to FIG. 6, a gate opening 232 may be formed in the dielectric layer 203 by removing a portion of the gate structure 220. The gate opening 232 may be subsequently used to accommodate a protection layer.

Removing a portion of the gate structure 220 may include removing a thickness portion of the gate electrode. In one embodiment, removing a portion of the gate structure 220 may include a dry etching process, or a wet etching process, etc.

Figure 7:
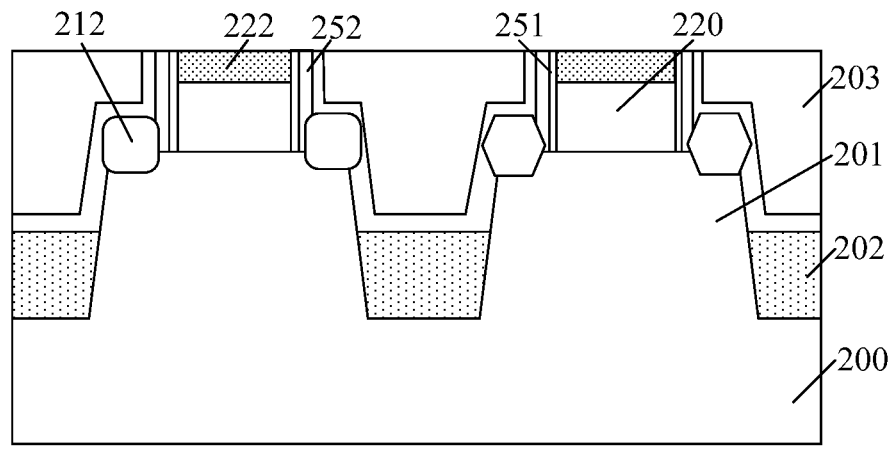

Returning to FIG. 13, after forming the gate opening, a protection layer may be formed (S106). FIG. 7 illustrates a corresponding semiconductor structure.

Referring to FIG. 7, a protection layer 222 may be formed in the gate opening 232. The protection layer 222 may protect the gate structure 220 when subsequently etching the dielectric layer 203 to form a contact hole.

In one embodiment, the protection layer 222 may be made of silicon nitride. When forming a contact hole by etching the dielectric layer 203, an etching selectivity ratio of the dielectric layer 203 over silicon nitride may be substantially large, and the loss of the protection layer 222 may be substantially small, such that the gate structure 220 may not be exposed.

In one embodiment, forming the protection layer 222 may include: forming an initial protection layer in the gate opening 232 and on the dielectric layer 203; and removing the initial protection layer on the dielectric layer 203 to form the protection layer 222 in the gate opening 232.

In one embodiment, the initial protection layer may be formed by a chemical vapor deposition process. In another embodiment, the initial protection layer may be formed by a physical vapor deposition process, or an atomic layer deposition process, etc.

Figure 8:
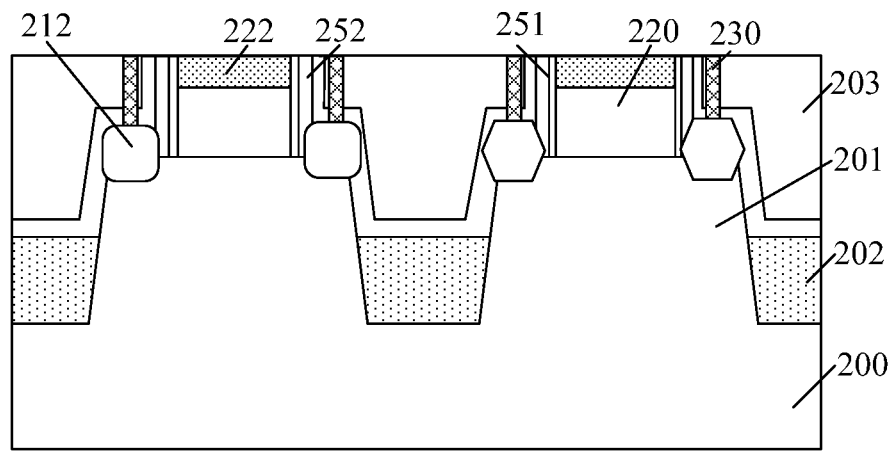

Returning to FIG. 13, after forming the protection layer, a source-drain plug may be formed (S107). FIG. 8 illustrates a corresponding semiconductor structure.

Referring to FIG. 8, a source-drain plug 230 may be formed in the dielectric layer 203. The source-drain plug 230 may be connected to the source and drain doped region 212. The source-drain plugs 230 may electrically connect the source and drain doped regions 212 to an external circuit.

After forming the protection layer 222, the source-drain plug 230 may be formed in the dielectric layer 203, and the source-drain plug 230 may be connected to the source and drain doped region 212.

Forming the source-drain plug 230 may include: forming a contact hole in the dielectric layer 203 by etching the dielectric layer 203, where a bottom of the contact hole may expose the source and drain doped region 212; and forming the source-drain plug 230 in the contact hole.

In one embodiment, the source-drain plugs 230 may be formed before subsequently forming an isolation structure. When forming the contact hole by etching the dielectric layer 203, an etching selectivity ratio of the dielectric layer 203 over the sidewall spacer may be substantially large. Even when the contact hole exposes the sidewall spacer, the loss of the sidewall spacer may be substantially small, such that the performance of the semiconductor structure may be improved. In another embodiment, before forming the source-drain plug, an isolation opening may be formed, and the isolation structure may be formed in the isolation opening.

In one embodiment, etching the dielectric layer 203 may include a dry etching process. In another embodiment, etching the dielectric layer may include a wet etching process. In one embodiment, the source-drain plug 230 may be made of aluminum. In another embodiment, the source-drain plug may be made of tungsten, or copper, etc. Forming the source-drain plug 230 in the contact hole may include a chemical vapor deposition process, or a physical vapor deposition process, etc.

In one embodiment, the protection layer 222 may be formed in the gate opening 232 before forming the source-drain plug 230, and the protection layer 222 may be removed after forming the source-drain plug 230. In another embodiment, the protection layer 222 may not be formed in the gate opening 232, and an isolation structure may be formed in the gate opening before forming the source-drain plug.

Figure 9:
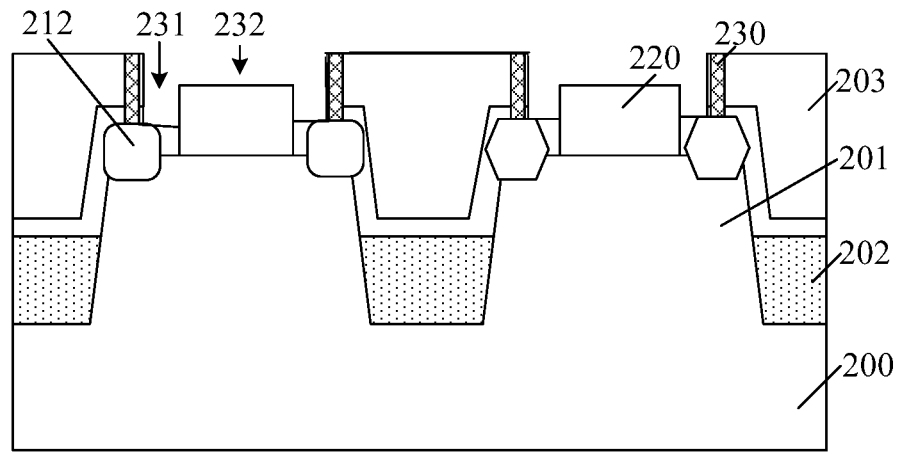

Returning to FIG. 13, after forming the source-drain plug, an isolation opening may be formed (S108). FIG. 9 illustrates a corresponding semiconductor structure.

Referring to FIG. 9, an isolation opening 231 may be formed in the dielectric layer 203 by at least partially removing the sidewall spacer. The isolation opening 231 may be subsequently used to accommodate an isolation structure.

In one embodiment, after forming the source-drain plug 230, the protection layer 222 (illustrated in FIG. 8) may be removed. In one embodiment, the protection layer 222 may be made of a same material as the sidewall spacer, and the protection layer 222 and the sidewall spacer may be removed through a same one process. In another embodiment, the protection layer may be made of a material different from the sidewall spacer. The protection layer may be removed after at least partially removing the sidewall spacer, or the sidewall spacer may be at least partially removed after removing the protection layer.

In one embodiment, removing the protection layer 222 and the sidewall spacer may include a dry etching process, or a wet etching process, etc. In one embodiment, the sidewall spacer may be partially removed along a height direction of the sidewall spacer due to the limitation of the process. In another embodiment, the entire sidewall spacer may be removed. In one embodiment, the entire protection layer 222 may be removed. In another embodiment, the protection layer may be partially removed.

An isolation structure may be subsequently formed in the isolation opening 231, and a dielectric constant of the isolation structure may be smaller than a dielectric constant of the sidewall spacer.

The gate structure 220, the source-drain plug 230, and the isolation structure between the source-drain plug 230 and the gate structure 220 may form a source-drain capacitor. The dielectric constant of the isolation structure may be smaller than the dielectric constant of the sidewall spacer, such that the dielectric constant of the isolation structure may be substantially small, and a capacitance value of the source-drain capacitor may be substantially small. Therefore, a parasitic capacitance of the formed semiconductor structure may be reduced, and the performance of the semiconductor structure may be improved.

In one embodiment, after removing the protection layer 222, an isolation structure may be formed in the gate opening 232 (also see FIG. 6). In one embodiment, the isolation structure may include a conformal layer at the bottom and sidewall surfaces of the isolation opening 231 and the gate opening 232, and an isolation material layer covering the conformal layer.

Figure 10:
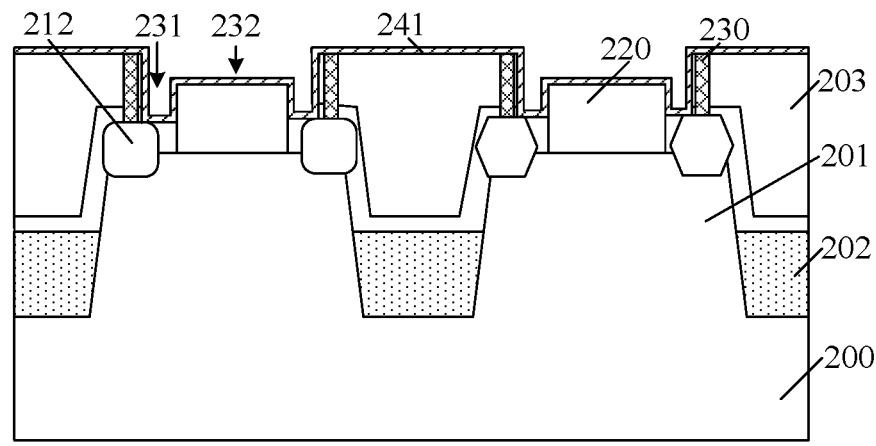

Returning to FIG. 13, after forming the isolation opening, a conformal layer may be formed (S109). FIG. 10 illustrates a corresponding semiconductor structure.

Referring to FIG. 10, a conformal layer 241 may be formed at the bottom and the sidewall surfaces of the isolation opening 231 and the gate opening 232. The conformal layer 241 may be used to isolate the gate structure 220 and a subsequently formed isolation material layer. In one embodiment, the conformal layer 241 may also be formed on the dielectric layer 203.

In one embodiment, the conformal layer 241 may be made of silicon oxide. In another embodiment, the conformal layer may be made of a low-K dielectric material, such as carbon-doped silicon oxide, or nitrogen-doped silicon carbide (BLOK) or fluorosilicone glass (FG), etc.

The conformal layer 241 may be formed by an atomic layer deposition process. The conformal layer 241 formed by the atomic layer deposition process may have desired step coverage performance, which may prevent the formation of air gaps between the conformal layer 241 and the gate structure 220, thereby the gate structure may be protected from being corroded by air in the gaps.

In one embodiment, the dielectric layer 203, the conformal layer 241, and an isolation material layer may be made of a same material. In another embodiment, the dielectric layer, the conformal layer and the isolation material layer may be made of different materials.

Returning to FIG. 13, after forming the conformal layer, an isolation material layer may be formed (S110). FIG. 11 illustrates a corresponding semiconductor structure.

Referring to FIG. 11, after forming the conformal layer 241, an isolation material layer 242 may be formed on the conformal layer 241 (illustrated in FIG. 10).

In one embodiment, the isolation material layer 242 may be made of silicon oxide. In another embodiment, the isolation material layer may be made of a low-K dielectric material. The low-K dielectric material may include a polyimide porous material, a polyethylene porous material, a fluoropolymer porous material, and a silsesquioxane-based porous composite material, or a zeolite polyimide composite porous material, etc.

In one embodiment, air gaps may be formed between the isolation material layer 242 and the conformal layer 241. Therefore, the dielectric constant of the isolation structure may be reduced, the parasitic capacitance of the formed semiconductor structure may be further reduced, and the performance of the semiconductor structure may be improved.

In one embodiment, the isolation material layer 242 may be formed by a chemical vapor deposition process. The isolation material layer 242 formed by the chemical vapor deposition process may have poor step coverage, and the air gaps may be easily formed between the isolation material layer 242 and the conformal layer 241. Therefore, the dielectric constant of the isolation structure may be reduced, the parasitic capacitance of the formed semiconductor structure may be further reduced, and the performance of the semiconductor structure may be improved.

In another embodiment, the isolation structure may include one material layer. Forming the isolation structure may include forming the isolation structure in the isolation opening and the gate opening through an atomic layer deposition process. The isolation structure may be made of silicon oxide, or a low-K dielectric material, etc.

Returning to FIG. 13, after forming the isolation material layer, a metal layer may be formed (S111). FIG. 12 illustrates a corresponding semiconductor structure.

Referring to FIG. 12, a metal layer 250 may be formed on the isolation structure above the gate opening 232. The metal layer 250 may be used to connect other devices to an external circuit.

The isolation structure may be formed in the gate opening 232. The gate electrode, the isolation structure, and the metal layer 250 on the isolation structure may form a gate capacitor. The dielectric constant of the isolation structure may be substantially small, such that a capacitance value of the gate capacitor may be substantially small. Therefore, the parasitic capacitance of the formed semiconductor structure may be further reduced, and the performance of the formed semiconductor structure may be improved.

In one embodiment, after forming the source-drain plug 230, the sidewall spacer may be at least partially removed to form the isolation openings 231. In another embodiment, the dielectric layer may be made of a material different from the isolation structure. Before forming the source-drain plug, the sidewall spacer may be at least partially removed to form the isolation opening, and the isolation structure may be formed in the isolation opening.

In the disclosed fabrication method of the semiconductor structure, the gate structure, the source-drain plug, and the isolation structure between the source-drain plug and the gate structure may form the source-drain capacitor. The dielectric constant of the isolation structure may be smaller than the dielectric constant of the sidewall spacer, such that the dielectric constant of the isolation structure may be substantially small, and the capacitance value of the source-drain capacitor may be substantially small. Therefore, the parasitic capacitance of the formed semiconductor structure may be reduced, and the performance of the semiconductor structure may be improved.

In addition, the conformal layer may be formed by an atomic layer deposition process. The conformal layer formed by the atomic layer deposition process may have desired step coverage performance, which may prevent the formation of air gaps between the conformal layer and the gate structure, thereby the gate structure may be protected from being corroded by air in the gap.

Moreover, air gaps may be formed between the isolation material layer and the conformal layer. Therefore, the dielectric constant of the isolation structure may be reduced, the parasitic capacitance of the formed semiconductor structure may be further reduced, and the performance of the semiconductor structure may be improved.

Further, the isolation structure may be formed in the gate opening. The gate electrode, the isolation structure, and the metal layer on the isolation structure may form the gate capacitor. The dielectric constant of the isolation structure may be substantially small, such that the capacitance value of the gate capacitor may be substantially small. Therefore, the parasitic capacitance of the formed semiconductor structure may be further reduced, and the performance of the semiconductor structure may be improved.

The present disclosure also provides a semiconductor structure. FIG. 12 illustrates a cross-sectional view of an exemplary semiconductor structure consistent with various disclosed embodiments of the present disclosure. Referring to FIG. 12, the semiconductor structure may include a substrate, a gate structure 220 on the substrate, a source and drain doped region 212 in the substrate on both sides of the gate structure 220, a dielectric layer 203 on the substrate, a source-drain plug 230 in the dielectric layer 203 and connected to the source and drain doped region 212, and an isolation structure between the source-drain plug 230 and the gate structure 220.

Forming the isolation structure may include forming an isolation opening between the source-drain plug 230 and the gate structure 220; and forming the isolation structure in the isolation opening. The isolation structure may include a conformal layer 241 covering a bottom and a sidewall surface of the isolation opening, and an isolation material layer 242 on the conformal layer 241.

A dielectric constant of the isolation structure may be smaller than a dielectric constant of silicon nitride. For example, a dielectric constant of the conformal layer 241 may be smaller than the dielectric constant of silicon nitride, and a dielectric constant of the isolation material layer 242 may be smaller than the dielectric constant of silicon nitride.

The isolation structure may be made of silicon oxide, silicon oxynitride, carbon-doped silicon oxide, nitrogen-doped silicon carbide, fluorosilicone glass, polyimide porous material, polyethylene porous material, fluoropolymer porous material, silsesquioxane-based porous composite, or zeolite polyimide composite porous material, etc.

In one embodiment, air gaps (not illustrated) may be formed between the conformal layer 241 and the isolation material layer 242. A gate opening may be formed in the dielectric layer 203, and the gate opening may expose a top of the gate structure 220. The isolation structure may also be formed in the gate opening. In one embodiment, the semiconductor structure may include a metal layer 250 on the isolation structure above the gate structure. The fabrication method of the disclosed semiconductor structure may be referred to the above-described embodiments of the present disclosure, and is not repeated herein.

Accordingly, in the disclosed semiconductor structure, the gate structure, the source-drain plug, and the isolation structure between the source-drain plug and the gate structure may form the source-drain capacitor. The dielectric constant of the isolation structure may be substantially small, such that the capacitance value of the source-drain capacitor may be substantially small. Therefore, the parasitic capacitance of the formed semiconductor structure may be reduced, and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    forming a gate structure and a dielectric layer, on a substrate;
    forming a sidewall spacer on a sidewall surface of the gate structure;
    forming a source and drain doped region in the substrate on both sides of the gate structure, wherein the dielectric layer covers a surface of the sidewall spacer;
    forming a gate opening by removing a portion of the gate structure;
    forming a source-drain plug in the dielectric layer, wherein the source-drain plug is connected to the source and drain doped region;
    forming an isolation opening in the dielectric layer by at least partially removing the sidewall spacer; and
    forming an isolation structure in the isolation opening and the gate opening, wherein the isolation structure has a dielectric constant less than the sidewall spacer.

2. The method according to claim 1, further including:
    forming a metal layer on the isolation structure above the gate opening.

3. The method according to claim 1, wherein:
    the isolation structure is formed in the gate opening after forming the source-drain plug, wherein the isolation structure is formed by:
        before forming the source-drain plug, forming a protection layer in the gate opening,
        after forming the source-drain plug and before forming the isolation structure, removing the protection layer, and
        after removing the protection layer, forming the isolation structure in the gate opening.

4. The method according to claim 1, wherein:
    the isolation structure is formed in the gate opening before forming the source-drain plug.

5. The method according to claim 1, wherein:
    the sidewall spacer is at least partially removed after forming the source-drain plug.

6. The method according to claim 1, wherein:
the sidewall spacer is at least partially removed before forming the source-drain plug; and
the isolation structure is formed in the isolation opening before forming the source-drain plug.

7. The method according to claim 1, wherein:
the dielectric layer is made of one of silicon oxide, silicon nitride, silicon oxynitride, and a low-K dielectric material, wherein the low-K dielectric material includes one of carbon-doped silicon oxide, nitrogen-doped silicon carbide, fluorosilicone glass, polyimide porous material, polyethylene porous material, fluoropolymer porous material, silsesquioxane based porous composite material, and zeolite polyimide composite porous material;
the isolation structure is made of one of silicon oxide, silicon oxynitride, carbon-doped silicon oxide, and a low-K dielectric material, wherein the low-K dielectric material includes one of nitrogen-doped silicon carbide, fluorosilicone glass, polyimide porous material, polyethylene porous material, fluoropolymer porous material, silsesquioxane based porous composite material, and zeolite polyimide composite porous material; and
the dielectric layer is made of a material different from the isolation structure.

8. The method according to claim 1, wherein forming the gate structure, the dielectric layer and the sidewall spacer includes:
forming a dummy gate structure on the substrate,
forming the sidewall spacer on a sidewall surface of the dummy gate structure,
forming the dielectric layer on the substrate to cover a surface of the sidewall spacer,
forming a dummy gate opening in the dielectric layer by removing the dummy gate structure, and
forming the gate structure in the dummy gate opening.

9. The method according to claim 1, wherein forming the source-drain plug includes:
forming a contact hole in the dielectric layer by etching the dielectric layer, wherein a bottom of the contact hole exposes the source and drain doped region, and
forming the source-drain plug in the contact hole.

10. The method according to claim 1, wherein:
the gate structure includes a gate dielectric layer at a bottom and a sidewall surface of a dummy gate opening in the dielectric layer, a work function layer on the gate dielectric layer, and a gate electrode on the work function layer, and
removing the portion of the gate structure includes removing a thickness portion of the gate electrode along a direction perpendicular to a surface of the substrate.

11. The method according to claim 1, wherein:
the sidewall spacer is made of silicon nitride; and
the isolation structure is made of one of silicon oxide, silicon oxynitride, and a low-K dielectric material, wherein the low-K dielectric material includes one of carbon-doped silicon oxide, nitrogen-doped silicon carbide, fluorosilicone glass, polyimide porous material, polyethylene porous material, fluoropolymer porous material, silsesquioxane based porous composite material, and zeolite polyimide composite porous material.

12. The method according to claim 1, wherein forming the isolation structure in the isolation opening includes:
forming a conformal layer on a bottom and a sidewall surface of the isolation opening, and
forming an isolation material layer in the isolation opening after forming the conformal layer.

13. The method according to claim 12, wherein forming the conformal layer includes:
an atomic layer deposition process.

14. The method according to claim 12, wherein forming the isolation material layer includes:
a chemical vapor deposition process, wherein air gaps are formed between the conformal layer and the isolation material layer.

15. A semiconductor structure, comprising:
a gate structure on a substrate;
a source and drain doped region in the substrate on both sides of the gate structure;
a dielectric layer on the substrate, wherein the dielectric layer covers a sidewall surface of the gate structure;
a source-drain plug in the dielectric layer, wherein the source-drain plug is connected to the source and drain doped region; and
an isolation structure between the source-drain plug, the gate structure, and in a gate opening in the dielectric layer, wherein the gate opening exposes a top of the gate structure.

16. The semiconductor structure according to claim 15, wherein the isolation structure includes:
a conformal layer on a bottom and a sidewall surface of an isolation opening formed between the source-drain plug and the gate structure, and
an isolation material layer covering the conformal layer, wherein air gaps are formed between the conformal layer and the isolation material layer.

17. The semiconductor structure according to claim 15, wherein:
the isolation structure is made of one of silicon oxide, silicon oxynitride, and a low-K dielectric material, wherein the low-K dielectric material includes one of carbon-doped silicon oxide, nitrogen-doped silicon carbide, fluorosilicone glass, polyimide porous material, polyethylene porous material, fluoropolymer porous material, silsesquioxane based porous composite material, and zeolite polyimide composite porous material.

18. The semiconductor structure according to claim 15, further including:
a metal layer on the isolation structure above the gate structure.

* * * * *